United States Patent
Liu et al.

(10) Patent No.: US 12,048,120 B2
(45) Date of Patent: Jul. 23, 2024

(54) HEAT DISSIPATION TOOTH PIECE AND PREPARATION METHOD THEREFOR, HEAT DISSIPATION APPARATUS AND ELECTRONIC DEVICE

(71) Applicant: ZTE CORPORATION, Shenzhen (CN)

(72) Inventors: Jin Liu, Shenzhen (CN); Xin Liu, Shenzhen (CN); Yan Wang, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 232 days.

(21) Appl. No.: 17/787,745

(22) PCT Filed: Mar. 8, 2021

(86) PCT No.: PCT/CN2021/079556
§ 371 (c)(1),
(2) Date: Jun. 21, 2022

(87) PCT Pub. No.: WO2021/180038
PCT Pub. Date: Sep. 16, 2021

(65) Prior Publication Data
US 2023/0078304 A1 Mar. 16, 2023

(30) Foreign Application Priority Data
Mar. 12, 2020 (CN) .......................... 202010171774.6

(51) Int. Cl.
*G06F 1/16* (2006.01)
*H05K 5/00* (2006.01)
(Continued)

(52) U.S. Cl.
CPC ................................ *H05K 7/20327* (2013.01)

(58) Field of Classification Search
CPC ............. H05K 7/20327; H05K 7/2029; H05K 7/20336; H05K 7/20381; H05K 7/20627;
(Continued)

(56) References Cited

U.S. PATENT DOCUMENTS 3,226,602 A 12/1965 Elfving
10,785,893 B1 * 9/2020 Kuo ........................ G06F 1/206
(Continued)

FOREIGN PATENT DOCUMENTS

CN 1330301 A 1/2002
CN 201726633 U 1/2011
(Continued)

OTHER PUBLICATIONS

International Searching Authority. International Search Report and Written Opinion for PCT Application No. PCT/CN2021/079556 and English translation, mailed Jun. 7, 2021, pp. 1-12.
(Continued)

*Primary Examiner* — Anthony M Haughton
(74) *Attorney, Agent, or Firm* — Vivacqua Crane, PLLC

(57) ABSTRACT

A heat dissipation tooth piece and a preparation method therefor, a heat dissipation apparatus and an electronic device are disclosed. The heat dissipation tooth piece including a first heat dissipation assembly and a second heat dissipation assembly which are oppositely arranged, the first heat dissipation assembly includes a first heat dissipation part, and the second heat dissipation assembly includes a second heat dissipation part; the first heat dissipation part and the second heat dissipation part are oppositely arranged and define a first pipeline, the first heat dissipation assembly further includes a first connection part, the second heat dissipation assembly further includes a second connection part, the first connection part and the second connection part
(Continued)

are connected and define a second pipeline, and the second pipeline is communicated with the first pipeline.

16 Claims, 4 Drawing Sheets

(51) Int. Cl.
    *H05K 7/00*         (2006.01)
    *H05K 7/20*         (2006.01)

(58) Field of Classification Search
    CPC . H05K 7/20663; H05K 7/20763; H05K 7/208
    See application file for complete search history.

(56) References Cited

U.S. PATENT DOCUMENTS

| | | | |
|---|---|---|---|
| 2010/0172105 A1 | 7/2010 | Liang | |
| 2016/0338226 A1* | 11/2016 | Sakamoto | H05K 7/20136 |
| 2018/0308780 A1 | 10/2018 | Tong et al. | |
| 2018/0343775 A1* | 11/2018 | Huang | H01L 25/18 |
| 2019/0203983 A1* | 7/2019 | Jeon | F25B 21/02 |
| 2019/0215988 A1* | 7/2019 | Wu | H05K 7/20336 |
| 2019/0245430 A1* | 8/2019 | You | H02M 7/003 |
| 2019/0368823 A1 | 12/2019 | Chan et al. | |
| 2020/0042053 A1* | 2/2020 | Cheng | H05K 7/20509 |
| 2021/0127527 A1* | 4/2021 | Chen | F28D 15/04 |

FOREIGN PATENT DOCUMENTS

| | | |
|---|---|---|
| CN | 201893330 U | 7/2011 |
| CN | 202617578 U | 12/2012 |
| CN | 206271692 U | 6/2017 |
| CN | 108762442 A | 11/2018 |
| JP | 2016012579 A | 1/2016 |
| TW | M397545 U | 2/2011 |

OTHER PUBLICATIONS

European Patent Office. Extended European Search Report for EP Application No. 21768955.3, mailed Dec. 7, 2022, pp. 1-9.

* cited by examiner

HEAT DISSIPATION TOOTH PIECE AND PREPARATION METHOD THEREFOR, HEAT DISSIPATION APPARATUS AND ELECTRONIC DEVICE

CROSS-REFERENCE TO RELATED APPLICATION

This application is a national stage filing under 35 U.S.C. § 371 of international application number PCT/CN2021/079556, filed Mar. 8, 2021, which claims priority to Chinese patent application No. 202010171774.6, filed Mar. 12, 2020. The contents of these applications are incorporated herein by reference in their entirety.

TECHNICAL FIELD

The present disclosure relates to the technical field of communications, and more particularly, to a heat dissipation tooth piece and a preparation method therefor, a heat dissipation apparatus and an electronic device.

BACKGROUND

In the field of electronic industry, the integration of equipment is getting increasingly higher, the volume of chips or core components is getting increasingly smaller, and the performance is getting increasingly better. If heat in a narrow space cannot be dissipated effectively in time, in non-serious cases, the performance of chips or core components may be greatly reduced at high temperature, and the energy consumption may be greatly increased; while in severe cases, instruments and equipment may be damaged.

As a new type of enhanced heat transfer element, a phase-change heat transfer plate may dissipate heat through latent heat, so that the heat transfer performance is more prominent on the basis of keeping the volume compact, has great application prospects and may be widely used in various military and civil industries. As a tooth piece, the heat transfer plate may be connected with a radiator base plate to form a radiator. Compared with a common metal tooth piece, the heat transfer plate has the advantages of higher thermal conductivity, better temperature uniformity and higher efficiency.

At present, the phase-change heat transfer plate is formed by connecting an upper plate and a lower plate, a shape of a pipeline is defined by printing between the two plates, and an internal pipeline is formed by means of the inflation process. For a heat dissipation assembly, the phase-change heat transfer plate is crimped on a heat dissipation base plate with a groove by means of the cogging process or the like. Due to the limitation of the compounding process and inflation process of the upper plate and the lower plate, sufficient length must be reserved from the internal pipeline to the edge to ensure that the working medium of the internal pipeline does not leak. Moreover, due to the limitation of the cogging process of the phase-change heat transfer plate and the heat dissipation base plate, a certain distance is required to be kept between the working medium in the phase-change heat transfer plate and the heat dissipation base plate, otherwise, the internal pipeline of the phase-change heat transfer plate may be damaged during cogging. These two aspects lead to the fact that the working medium in the phase-change heat transfer plate is far away from the heat dissipation base plate, making the thermal resistance large, which is not conducive to rapid heat conduction of the device.

SUMMARY

In view of this, embodiments of the present disclosure provide a heat dissipation tooth piece and a preparation method therefor, a heat dissipation apparatus and an electronic device, so as to solve one of the related technical problems at least to some extent.

In accordance with an aspect of the present disclosure, an embodiment provides a heat dissipation tooth piece, which may include a first heat dissipation assembly and a second heat dissipation assembly which are oppositely arranged, where the first heat dissipation assembly includes a first heat dissipation part, and the second heat dissipation assembly includes a second heat dissipation part. The first heat dissipation part and the second heat dissipation part are oppositely arranged and define a first pipeline. The first heat dissipation assembly further includes a first connection part, and the second heat dissipation assembly further includes a second connection part. The first connection part and the second connection part are connected and define a second pipeline, and the second pipeline is communicated with the first pipeline.

In accordance with an aspect of the present disclosure, an embodiment provides a preparation method for the heat dissipation tooth piece, which may include: forming a first heat dissipation assembly having a first heat dissipation part and a first connection part, and forming a second heat dissipation assembly having a second heat dissipation part and a second connection part, where the first heat dissipation part and the second heat dissipation part are oppositely arranged and define a first pipeline, and the first connection part and the second connection part are connected and oppositely arranged and define a second pipeline. The first pipeline is communicated with the second pipeline.

In accordance with an aspect of the present disclosure, an embodiment provides a heat dissipation apparatus, which may include the above-mentioned heat dissipation tooth piece and a heat dissipation base plate. The heat dissipation tooth piece is connected with the heat dissipation base plate.

In accordance with an aspect of the present disclosure, an embodiment provides an electronic device, which may include the above-mentioned heat dissipation apparatus.

Figure 1:
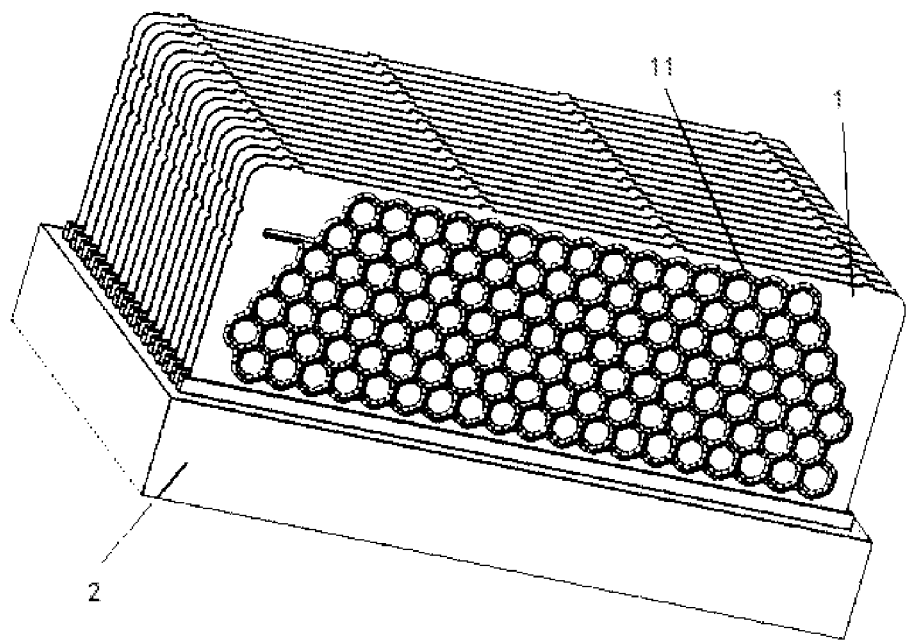
FIG. 1 is a schematic structural diagram of a heat dissipation apparatus.

Reference numerals: 1. Heat dissipation tooth piece; 2. Heat dissipation base plate; 11. First pipeline; 12. Second pipeline; 13. Working medium; 101. First heat dissipation assembly; 102. Second heat dissipation assembly; 111. First heat dissipation part; 112. First connection part; 121. Second heat dissipation part; 122. Second connection part.

DETAILED DESCRIPTION

In order to enable those having ordinary skill in the art to better understand the technical scheme of the present disclosure, the present disclosure will be further described in detail below with reference to the drawings and specific embodiments.

Unless otherwise defined, the technical terms or scientific terms used in the present disclosure shall have the ordinary meanings understood by those having ordinary skill in the art to which the present disclosure belongs. "First", "second" and similar words used in the present disclosure do not indicate any order, quantity or importance, but are only used to distinguish different components. Similarly, "a", "one", "the" and other similar words do not indicate the quantity limit, but the existence of at least one. "Comprise", "include" and other similar words mean that the elements or objects appearing before the word cover the listed elements or objects and their equivalents appearing after the word, without excluding other elements or objects. "Connected", "connecting" and other similar words may be not limited to physical or mechanical connection, but may include electrical connection, regardless of direct connection or indirect connection. Terms such as "upper", "lower", "left", "right", etc. are only used to indicate relative positional relationships. If the absolute positions of the described objects change, the relative position relationships may also change accordingly.

FIG. 1 illustrates a heat dissipation apparatus, as shown in FIG. 1, the heat dissipation apparatus is composed of a heat dissipation base plate 2 and a plurality of heat dissipation tooth pieces 1 (i.e., phase-change heat transfer plates), where the heat dissipation base plate 2 is provided with a plurality of rows of grooves arranged at intervals, and the heat dissipation tooth pieces 1 are arranged in one-to-one correspondence with the grooves and are riveted with the grooves. Certainly, the heat dissipation tooth pieces 1 are connected to the heat dissipation base plate 2 by glue. The heat dissipation tooth piece 1 may be vertically arranged relative to the heat dissipation base plate 2 or obliquely arranged relative to the heat dissipation base plate 2. When the heat dissipation apparatus is used in an electronic device, the side of the heat dissipation base plate 2 facing away from the heat dissipation tooth piece 1 is connected to a heat source in the electronic device. For example, the surface of a heating element may be attached to the base plate through heat conduction glue or heat conduction medium to reduce the contact thermal resistance.

Figure 2:
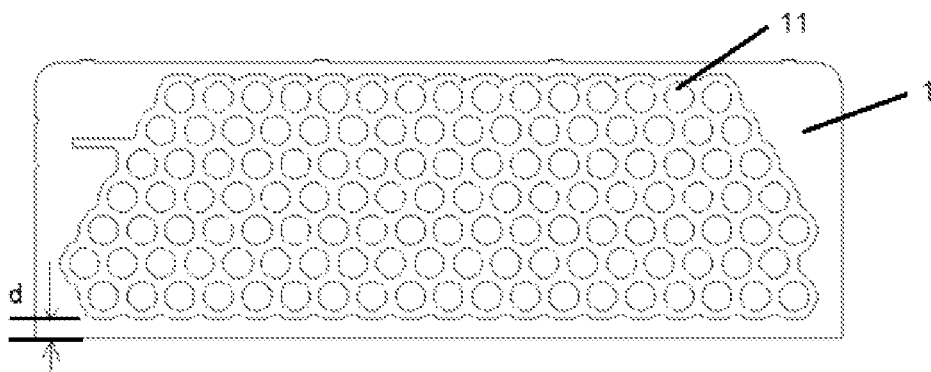
FIG. 2 is a top view illustrating a heat dissipation tooth piece of the heat dissipation apparatus shown in FIG. 1.
Figure 3:
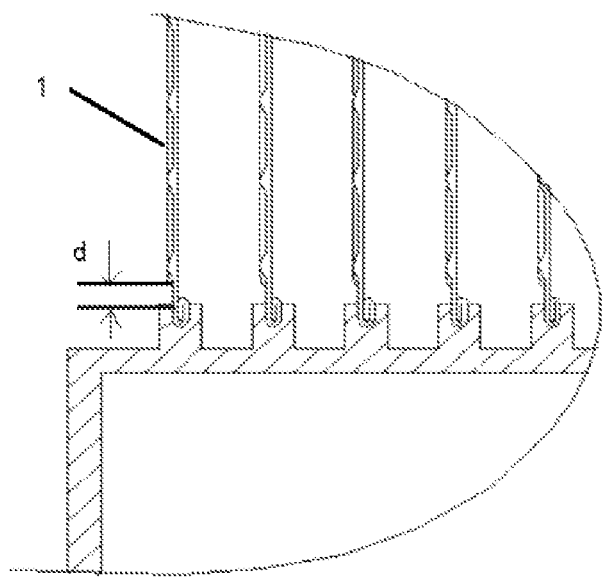
FIG. 3 is a cross-sectional view illustrating the heat dissipation tooth piece of the heat dissipation apparatus shown in FIG. 1.

FIG. 2 is a top view illustrating a heat dissipation tooth piece 1; and FIG. 3 is a cross-sectional view illustrating the heat dissipation tooth piece 1. As shown in FIGS. 2 and 3, the heat dissipation tooth piece 1 includes a first heat dissipation assembly and a second dissipation assembly which are oppositely arranged, and the first heat dissipation assembly and the second heat dissipation assembly are formed by bending a plate, where the first heat dissipation assembly is provided with a plurality of first heat dissipation parts formed by means of the inflation process and is sealed together with the second heat dissipation assembly, and then a plurality of first pipelines 11 are formed. Due to the limitation of the compounding process and inflation process of the plate of the first dissipation assembly and the second heat dissipation assembly, a certain distance is kept between the first pipelines 11 in the row closest to the grooves of the heat dissipation base plate 2 and the heat dissipation base plate 2, that is, the distance d indicated in FIGS. 2 and 3.

However, the inventor found that the working medium in the first pipelines 11 is far away from the heat dissipation base plate 2 due to the existence of the distance d, making the thermal resistance large, which is not conducive to rapid conduction of heat of the electronic device.

In view of the above technical problems, embodiments of the present disclosure provide the following technical schemes.

Figure 4:
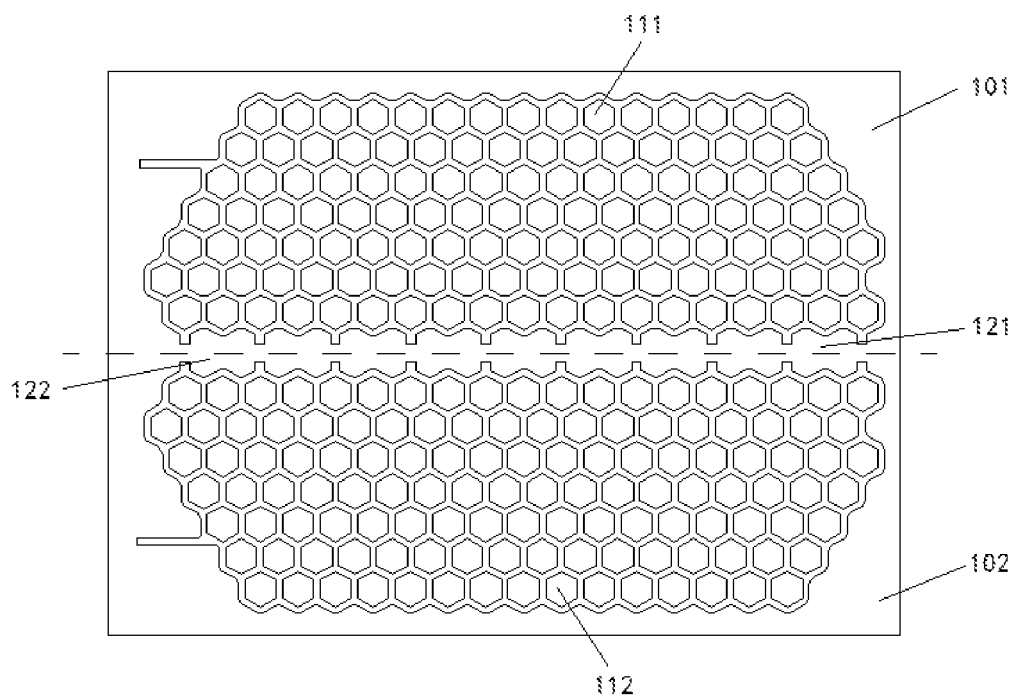
FIG. 4 is an expanded schematic diagram illustrating a heat dissipation tooth piece of an embodiment of the present disclosure.
Figure 5:
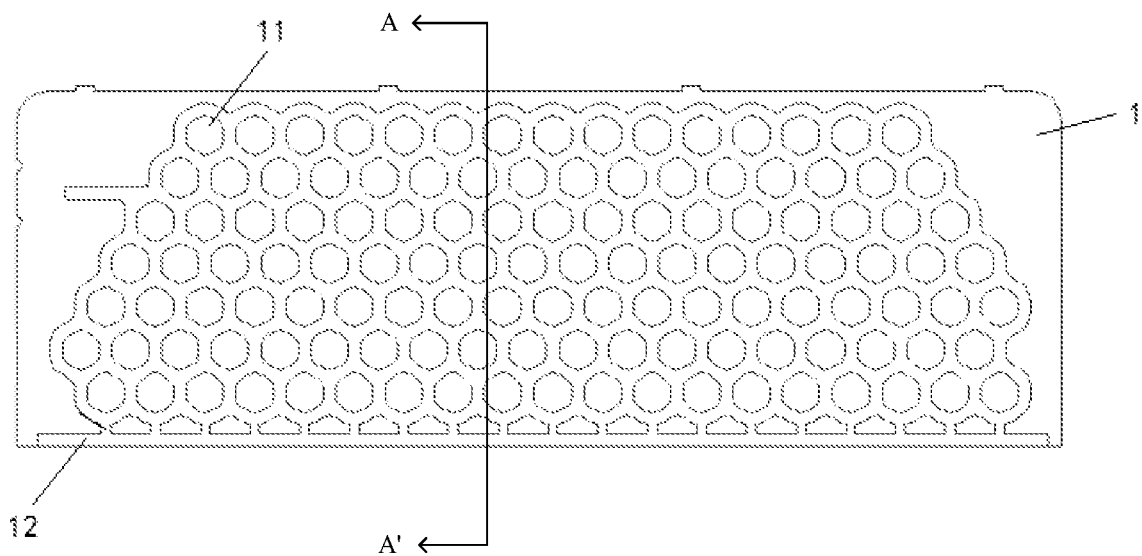
FIG. 5 is a top view illustrating the heat dissipation tooth piece of the embodiment of the present disclosure.
Figure 6:
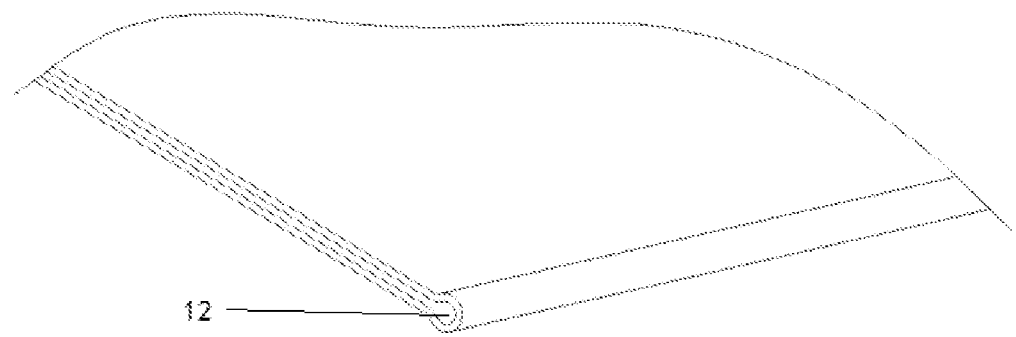
FIG. 6 is a side view illustrating the heat dissipation tooth piece of the embodiment of the present disclosure.
Figure 7:
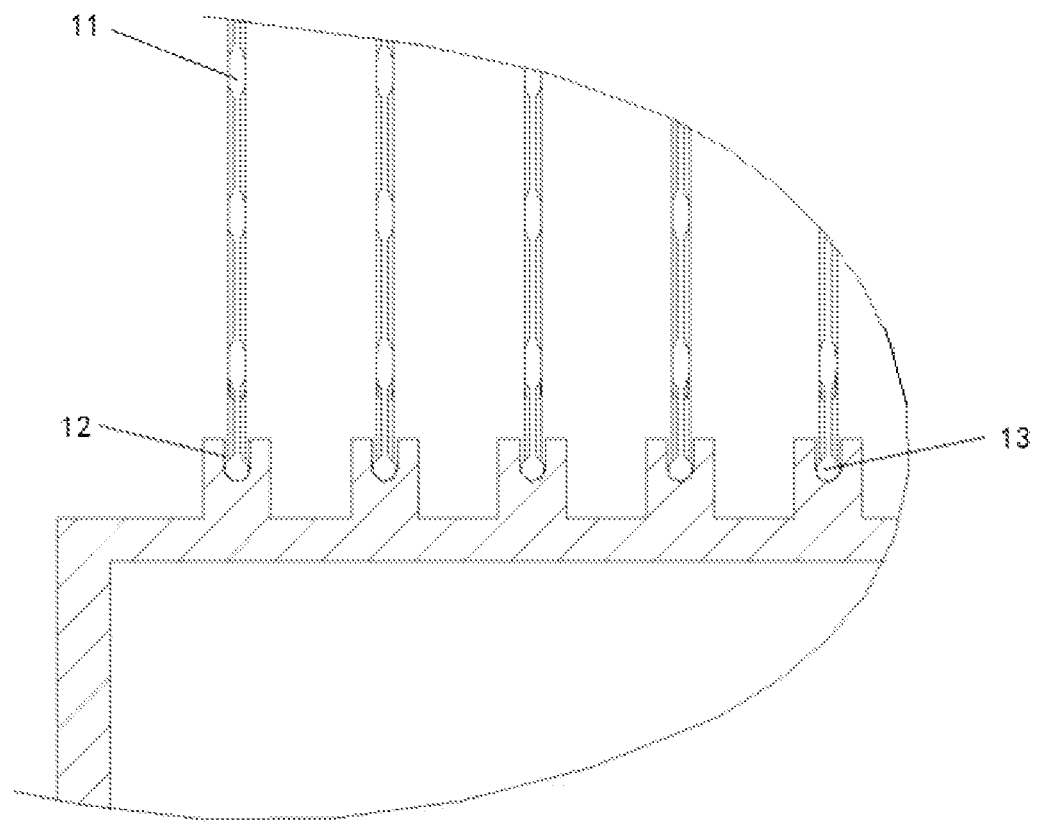
FIG. 7 is a cross-sectional view illustrating the heat dissipation tooth piece of the embodiment of the present disclosure.

In accordance with an aspect of the present disclosure, an embodiment of the present disclosure provides a heat dissipation tooth piece 1. FIG. 4 is an expanded schematic diagram illustrating a heat dissipation tooth piece of an embodiment of the present disclosure; FIG. 5 is a top view illustrating the heat dissipation tooth piece 1 of the embodiment of the present disclosure; FIG. 6 is a side view illustrating the heat dissipation tooth piece 1 of the embodiment of the present disclosure; and FIG. 7 is a cross-sectional view illustrating the heat dissipation tooth piece 1 of the embodiment of the present disclosure. As shown in FIGS. 4-7, the heat dissipation tooth piece 1 includes a first heat dissipation assembly 101 and a second heat dissipation assembly 102. The first heat dissipation assembly 101 is provided with a first heat dissipation part 111 and a first connection part 112, and the second heat dissipation assembly 102 is provided with a second heat dissipation part 121 and a second connection part 122. The first heat dissipation part 111 and the second heat dissipation part 121 are oppositely arranged and define a first pipeline 11; the first connection part 112 and the second connection part 122 are connected and oppositely arranged and define a second pipeline, and the second pipeline is communicated with the first pipeline 11.

It should be noted here that the first pipeline 11 and the second pipeline may be filled with working medium for better heat dissipation. Thus, the edges of the first heat dissipation assembly 101 and the second heat dissipation assembly 102 are sealed together, to enable the first pipeline 11 and the second pipeline to form a closed pipeline.

In the embodiment of the present disclosure, the first heat dissipation assembly 101 is connected with the second connection part 122 of the second heat dissipation assembly 102 by the first connection part 112, and a second pipeline is formed, so connecting the second pipeline with the heat dissipation base plate 2 may reduce the thermal resistance, being conducive to rapid conduction of heat generated by the electronic device.

In some embodiments, the first connection part 112 of the first heat dissipation assembly 101 and the second connection part 122 of the second heat dissipation assembly 102 are of an integrated structure. That is to say, the first heat dissipation assembly 101 and the second heat dissipation assembly 102 are formed adopting a plate, in this way, the process of forming the heat dissipation tooth piece 1 is simple, and the first connection part 112 of the first heat dissipation assembly 101 and the second connection part 122 of the second heat dissipation assembly 102 are of an integrated structure, so that the formed second pipeline has no connection gap and has better sealing performance. It should be noted here that at this time, the first heat dissipation assembly 101 and the second heat dissipation assembly 102 are of an integrated structure as well.

In some embodiments, the first heat dissipation part 111 and the second heat dissipation part 121 are multiple in number respectively, and the first heat dissipation parts 111 and the second heat dissipation parts 121 are arranged in one-to-one correspondence and define a plurality of first pipelines 11, and adjacent first pipelines 11 are communicated, so that each first pipeline 11 is communicated with the second pipeline.

The first heat dissipation parts 111 illustrated in FIG. 5 are upper concave patterns formed on the side face of the first heat dissipation assembly 101 close to the second heat dissipation assembly 102, and the second heat dissipation parts 121 are upper concave patterns formed on the side face of the second heat dissipation assembly 102 close to the first heat dissipation assembly 101. At this time, the plurality of first pipelines 11 formed are arranged in a honeycomb shape. The concave patterns of the first heat dissipation assembly 101 and the second heat dissipation assembly 102 illustrated in FIG. 5 are all circular concave pits, which does not constitute a limitation to the embodiments of the present disclosure. In fact, the concave patterns may also be continuous groove structures extending in the length direction or width direction of the heat dissipation tooth piece 1, may be square concave pits or the like.

In some embodiments, as shown in FIGS. 5 and 7, in the embodiment of the present disclosure, the cross section of the second pipeline perpendicular to the length direction (i.e., the cutting direction along the A-A' shown in FIG. 5) of the heat dissipation tooth piece 1 is circular. Certainly, the cross section of the second pipeline perpendicular to the length direction of the heat dissipation tooth piece 1 may also be oval, trapezoidal or the like. In the embodiment of the present disclosure, the shape of the cross section of the second pipeline perpendicular to the length direction of the heat dissipation tooth piece 1 is not limited.

In some embodiments, the edges of the first heat dissipation assembly 101 and the second heat dissipation assembly 102 are sealed together, for example, by welding or crimping. Welding may be achieved by means of vacuum diffusion welding or laser welding, while crimping may be achieved by means of hot pressing.

The following table shows a comparison between the thermal resistance and temperature of the heat dissipation tooth piece 1 shown in FIGS. 1-3 and the heat dissipation tooth piece 1 of the embodiments of the present disclosure, which is made by the inventor. For example, the distance d shown in FIGS. 2 and 3 is 6 mm, and the plate thickness of each of the heat dissipation tooth piece 1 shown in FIGS. 1-3 and the heat dissipation tooth piece 1 of the embodiments of the present disclosure is 1.2 mm. The comparison of the power consumption of the heat dissipation tooth pieces when being heated uniformly at 1130 W is as follows:

| | Thermal resistance | Maximum temperature difference of heat dissipation tooth pieces 1 |
|---|---|---|
| Heat dissipation tooth piece 1 shown in FIGS. 1-3 | 0.32° C./W | 11.144° C. |
| Heat dissipation tooth piece 1 of the embodiments of the present disclosure | 0.28° C./W | 8.998° C. |

By comparison, it can be seen that the thermal resistance of the heat dissipation tooth piece 1 of the embodiments of the present disclosure is reduced by 12.5%, and the temperature difference is reduced by 2.146° C., so the temperature distribution of the heat dissipation tooth piece 1 is more uniform. The pipeline (the second pipeline) of the heat dissipation tooth piece 1 of the embodiments of the present disclosure is closer to the heat source, and heat is quickly transferred to the refrigerant at the second pipeline through the bottom of the heat dissipation tooth piece 1, so the phase change starts faster, the refrigerant quickly undergoes phase change to take away the heat, and the time for the system to reach steady state is reduced. Meanwhile, due to the reduction of the distance, the heat conduction path and thermal resistance are reduced, and the heat transfer efficiency is improved.

In accordance with an aspect of the present disclosure, for the above-mentioned heat dissipation tooth piece 1, an embodiment of the present disclosure provides a preparation method for the heat dissipation tooth piece 1, the method including:

forming a first heat dissipation assembly 101 with a first heat dissipation part 111 and a first connection part 112, and forming a second heat dissipation assembly 102 with a second heat dissipation part 121 and a second connection part 122, where the first heat dissipation part and the second heat dissipation part are oppositely arranged and define a first pipeline 11, and the first connection part 112 and the second connection part 122 are connected and oppositely arranged and define a second pipeline. The first pipeline 11 is communicated with the second pipeline.

In the embodiment of the present disclosure, the first heat dissipation assembly 101 is connected with the second connection part 122 of the second heat dissipation assembly 102 by the first connection part 112, and a second pipeline is defined, so connecting the second pipeline with the heat dissipation base plate 2 may reduce the thermal resistance, being conducive to rapid conduction of heat generated by the electronic device.

In some embodiments, forming a first heat dissipation assembly 101 with a first heat dissipation part 111 and a first connection part 112 and forming a second heat dissipation assembly 102 with a second heat dissipation part 121 and a second connection part 122 specifically includes:

Providing a plate, the plate including a first area and a second area which are arranged side by side, that is, an upper area and a lower area which are shown in FIG. 4.

Forming the first heat dissipation part 111 and the first connection part 112 in the first area, and forming the second heat dissipation part 121 and the second connection part 122 in the second area.

Folding along the boundary (that is, the dotted line shown in FIG. 4) between the first connection part 112 and the second connection part 122 to form the first heat dissipation assembly 101 and the second heat dissipation assembly 102 which are oppositely arranged.

In some embodiments, after forming the first heat dissipation assembly 101 and the second heat dissipation assembly 102 which are oppositely arranged, the method of the embodiment of the present disclosure further includes sealing the edges of the first heat dissipation assembly 101 and the second heat dissipation assembly 102, to enable the first pipeline 11 to form a closed pipeline.

It should be noted here that in order to infuse the working medium into the first pipeline 11 and the second pipeline, inlets for the infusion of the working medium may not be sealed in this step.

In some embodiments, sealing the edges of the first heat dissipation assembly 101 and the second heat dissipation assembly 102 may be performed by welding specifically: sealing the edges of the first heat dissipation assembly 101 and the second heat dissipation assembly 102, to enable the first pipeline 11 to form a closed pipeline. Welding includes, but is not limited to, vacuum diffusion welding or laser welding. Certainly, in some embodiments, the edges of the first heat dissipation assembly 101 and the second heat dissipation assembly 102 may be sealed by hot pressing in this step, to enable the first pipeline 11 to form a closed pipeline.

In some embodiments, after forming the second pipeline, further including: placing an aluminum wire and/or woven aluminum net in the second pipeline to improve the heat transfer efficiency and the anti-gravity performance of the heat dissipation tooth piece 1.

In a first example, the preparation method for the heat dissipation tooth piece 1 of the embodiment of the present disclosure specifically includes following steps:

Providing a plate, where one surface of the plate is a composite surface, and the surface opposite to the composite surface is a non-composite surface; conducting surface treatment such as wire drawing or polishing on the composite surface of the plate, and then making channels on the composite surface, that is, forming a first sealing structure and a first connection part 112 in the first area, and forming a second sealing structure and a second connection part 122 in the second area.

Folding the plate at the middle of the plate (i.e., the boundary between the first connection part 112 and the second connection part 122), leaving a gap at the folded part to form a second pipeline; attaching the composite surface of the first area and the composite surface of the second area of the folded plate, and forming the first heat dissipation assembly 101 and the second heat dissipation assembly 102 which are arranged in pair at this time.

Forming an aluminum wire and/or aluminum wire woven aluminum net in the second pipeline to improve the heat transfer efficiency and anti-gravity performance of the phase-change heat transfer plate.

Compounding the first heat dissipation assembly 101 and second heat dissipation assembly 102 which are formed after folding together by welding, such as vacuum diffusion welding or laser welding, so that the first pipeline 11 is communicated with the second pipeline to form a closed pipeline.

Infusing heat transfer working medium in the first pipeline 11 and the second pipeline, and sealing pipeline inlets.

Completing the preparation of the heat dissipation tooth piece 1.

A second example, which is similar to the first example, differs only in that the first heat dissipation assembly 101 and the second heat dissipation assembly 102 formed after folding are compounded together by hot pressing, so that the first pipeline 11 is communicated with the second pipeline to form a closed pipeline. Other steps are the same as those in the first example, which will not be repeated here.

In accordance with an aspect of the present disclosure, an embodiment provides a heat dissipation apparatus, including: any one of the above-mentioned heat dissipation tooth pieces 1 and a heat dissipation base plate 2, the heat dissipation tooth pieces 1 being arranged on the heat dissipation base plate 2 at intervals.

In some embodiments, the heat dissipation tooth pieces 1 may be connected to the heat dissipation base plate 2 by glue to form a heat dissipation apparatus.

In some embodiments, the heat dissipation base plate 2 is provided a plurality of grooves arranged side by side, and the heat dissipation tooth pieces 1 are arranged in one-to-one correspondence with the grooves and riveted with the grooves. For example, the second pipeline of the heat dissipation tooth piece 1 may be fastened in the grooves by pressing the edge outside the grooves of the heat dissipation base plate 2 with a tool, and then the heat dissipation tooth pieces 1 are connected with the heat dissipation base plate 2 to form an efficient heat dissipation apparatus.

Figure 8:
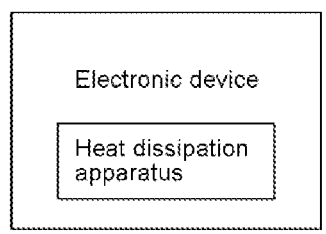
FIG. 8 is a schematic diagram illustrating an electronic device of an embodiment of the present disclosure.

Referring to FIG. 8, in accordance with an aspect of the present disclosure, an embodiment provides an electronic device, including: the above-mentioned heat dissipation apparatus, where the side face of the heat dissipation base plate 2 of the heat dissipation apparatus facing away from the heat dissipation tooth pieces 1 is connected with a heating element of the electronic device.

In some embodiments, the heating element is connected with the heat dissipation base plate 2 through heat conduction glue or heat conduction medium, so that heat generated by the heating element is well conducted to the heat dissipation apparatus to improve the heat dissipation efficiency.

In the embodiments of the present disclosure, the first heat dissipation assembly is connected with the second connection part of the second heat dissipation assembly by the first connection part, and a second pipeline is formed, so connecting the second pipeline with the heat dissipation base plate may reduce the thermal resistance, being conducive to rapid conduction of heat generated by the electronic device.

It can be understood that the above embodiments are only exemplary embodiments adopted to explain the principles of the present disclosure, but the present disclosure is not limited thereto. For those having ordinary skill in the art, various variations and improvements can be made without departing from the scope of the present disclosure, and all of which should be considered to belong to the protection scope of the present disclosure.

What is claimed is:

1. A heat dissipation tooth piece, comprising a first heat dissipation assembly and a second heat dissipation assembly which are oppositely arranged, wherein the first heat dissipation assembly comprises a first heat dissipation part, and the second heat dissipation assembly comprises a second heat dissipation part;
   the first heat dissipation part and the second heat dissipation part are oppositely arranged and define a first pipeline, wherein
      the first heat dissipation assembly further comprises a first connection part,
      the second heat dissipation assembly further comprises a second connection part,
      the first connection part and the second connection part are connected and define a second pipeline, and
      the second pipeline is communicated with the first pipeline.

2. The heat dissipation tooth piece of claim 1, wherein the first heat dissipation part, the second heat dissipation part, the first connection part and the second connection part are of an integrated structure.

3. The heat dissipation tooth piece of claim 1, wherein a plurality of the first heat dissipation part and a plurality of the second heat dissipation part are provided, and
   the first heat dissipation parts and the second heat dissipation parts are arranged in one-to-one correspondence and define a plurality of first pipelines; and
   adjacent first pipelines are communicated with each other.

4. The heat dissipation tooth piece of claim 1, wherein edges of the first heat dissipation assembly and the second heat dissipation assembly are welded or crimped.

5. The heat dissipation tooth piece of claim 1, wherein a cross section of the second pipeline perpendicular to a length direction of the heat dissipation tooth piece is circular, oval or trapezoidal.

6. A preparation method for a heat dissipation tooth piece, comprising
- forming a first heat dissipation assembly having a first heat dissipation part and a first connection part, and
- forming a second heat dissipation assembly having a second heat dissipation part and a second connection part,
  - wherein the first heat dissipation part and the second heat dissipation part are oppositely arranged and define a first pipeline, and the first connection part and the second connection part are connected and oppositely arranged and define a second pipeline; and
  - the first pipeline is communicated with the second pipeline.

7. The preparation method of claim 6, wherein forming a first heat dissipation assembly having a first heat dissipation part and a first connection part and forming a second heat dissipation assembly having a second heat dissipation part and a second connection part comprises:
- providing a plate, the plate including a first area and a second area which are arranged side by side;
- forming the first heat dissipation part and the first connection part in the first area, and forming the second heat dissipation part and the second connection part in the second area; and
- folding along a boundary between the first connection part and the second connection part to form the first heat dissipation assembly and the second heat dissipation assembly which are oppositely arranged.

8. The preparation method of claim 6, further comprising:
- sealing edges of the first heat dissipation assembly and the second heat dissipation assembly.

9. The preparation method of claim 8, wherein sealing edges of the first heat dissipation assembly and the second heat dissipation assembly comprises:
- welding the edges of the first heat dissipation assembly and the second heat dissipation assembly by laser welding or hot pressing to seal the two.

10. The preparation method of claim 6, further comprising: arranging an aluminum wire and/or aluminum nets in the second pipeline.

11. A heat dissipation apparatus, comprising:
- a heat dissipation tooth piece, comprising a first heat dissipation assembly and a second heat dissipation assembly which are oppositely arranged,
  - wherein the first heat dissipation assembly comprises a first heat dissipation part, and the second heat dissipation assembly comprises a second heat dissipation part;
  - the first heat dissipation part and the second heat dissipation part are oppositely arranged and define a first pipeline,
    - wherein the first heat dissipation assembly further comprises a first connection part,
    - the second heat dissipation assembly further comprises a second connection part,
    - the first connection part and the second connection part are connected and define a second pipeline, and the second pipeline is communicated with the first pipeline; and
- a heat dissipation base plate;
  - wherein the heat dissipation tooth piece is connected with the heat dissipation base plate.

12. The heat dissipation apparatus of claim 11, wherein the heat dissipation tooth piece is connected with the heat dissipation base plate by glue.

13. The heat dissipation apparatus of claim 11, wherein the heat dissipation base plate is provided with a groove, and the second pipeline of the heat dissipation tooth piece is riveted with the groove.

14. An electronic device, comprising the heat dissipation apparatus of claim 11.

15. The preparation method of claim 7, further comprising:
- sealing edges of the first heat dissipation assembly and the second heat dissipation assembly.

16. The preparation method of claim 7, further comprising: arranging an aluminum wire and/or aluminum nets in the second pipeline.

* * * * *